(12) United States Patent
Wong et al.

(10) Patent No.: US 9,835,012 B2
(45) Date of Patent: Dec. 5, 2017

(54) SIMPLIFIED COMPOSITIONAL MODELS FOR CALCULATING PROPERTIES OF MIXED FLUIDS IN A COMMON SURFACE NETWORK

(71) Applicant: Landmark Graphics Corporation, Houston, TX (US)

(72) Inventors: Terry Wong, Houston, TX (US); Graham Fleming, Houston, TX (US)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 0 days.

(21) Appl. No.: 14/770,069

(22) PCT Filed: Mar. 12, 2015

(86) PCT No.: PCT/US2015/020298
§ 371 (c)(1),
(2) Date: Aug. 24, 2015

(87) PCT Pub. No.: WO2015/138810
PCT Pub. Date: Sep. 17, 2015

(65) Prior Publication Data
US 2016/0369600 A1    Dec. 22, 2016

Related U.S. Application Data

(60) Provisional application No. 61/951,825, filed on Mar. 12, 2014.

(51) Int. Cl.
*E21B 41/00* (2006.01)
*E21B 43/25* (2006.01)
(Continued)

(52) U.S. Cl.
CPC .......... *E21B 41/0092* (2013.01); *E21B 43/00* (2013.01); *E21B 47/06* (2013.01);
(Continued)

(58) Field of Classification Search
CPC ............ G01V 99/005; G01V 2210/644; G06F 2217/16; G06F 17/16; E21B 43/25;
(Continued)

(56) References Cited

U.S. PATENT DOCUMENTS 7,289,943 B2 * 10/2007 Barroux .................... E21B 4/04
 702/13
8,055,490 B2 * 11/2011 Kim ..................... G06F 17/5018
 703/9

(Continued)

FOREIGN PATENT DOCUMENTS

WO    WO-2007058662 A1    5/2007
WO    WO-2013188087 A1    12/2013

OTHER PUBLICATIONS

International Search Report and Written Opinion, dated Jul. 7, 2015, 9 pages; Korean International Searching Authority.

(Continued)

*Primary Examiner* — Akash Saxena

(57) ABSTRACT

System and methods of simulating fluid production in a multi-reservoir system with a common surface network are presented. An equation of state (EOS) characterization of fluids is matched with a delumped EOS model representing different components of the fluids for each reservoir within the multi-reservoir system. Fluid production in the multi-reservoir system is simulated for at least one simulation point in the common surface network, based in part on the delumped EOS model for each reservoir. If the fluids produced during the simulation at the simulation point are mixed fluids from different reservoirs, one or more interpolation tables representing the mixed fluids are generated and properties of the mixed fluids are calculated based on the generated interpolation tables. Otherwise, the properties of the fluids are calculated using the delumped EOS model (Continued)

corresponding to the reservoir from which the fluids are produced.

17 Claims, 5 Drawing Sheets

(51) Int. Cl.
| | | |
|---|---|---|
| G01V 9/00 | (2006.01) | |
| G06F 17/50 | (2006.01) | |
| G06Q 50/06 | (2012.01) | |
| E21B 43/00 | (2006.01) | |
| E21B 47/06 | (2012.01) | |
| E21B 49/00 | (2006.01) | |
| E21B 49/08 | (2006.01) | |
| G01V 99/00 | (2009.01) | |
| E21B 21/08 | (2006.01) | |

(52) U.S. Cl.
CPC ............ *E21B 47/065* (2013.01); *E21B 49/00* (2013.01); *E21B 49/08* (2013.01); *G06F 17/5009* (2013.01); *E21B 21/08* (2013.01); *E21B 43/25* (2013.01); *E21B 2049/085* (2013.01); *G01V 99/005* (2013.01); *G06Q 50/06* (2013.01)

(58) Field of Classification Search
CPC ...... E21B 21/08; E21B 41/0092; E21B 47/06; E21B 47/065; E21B 49/00; E21B 2019/085
See application file for complete search history.

(56) References Cited

U.S. PATENT DOCUMENTS

| | | | | |
|---|---|---|---|---|
| 8,731,892 | B2* | 5/2014 | Al-Shammari | G06F 17/5009 703/10 |
| 2005/0065759 | A1* | 3/2005 | Barroux | E21B 4/04 703/10 |
| 2006/0282243 | A1* | 12/2006 | Childs | G06F 17/5009 703/10 |
| 2007/0061087 | A1* | 3/2007 | Ghorayeb | E21B 49/00 702/30 |
| 2007/0112547 | A1* | 5/2007 | Ghorayeb | E21B 41/00 703/10 |
| 2007/0119244 | A1* | 5/2007 | Goodwin | E21B 47/10 73/152.28 |
| 2008/0208539 | A1 | 8/2008 | Lee et al. | |
| 2009/0138213 | A1* | 5/2009 | Watts, III | G06Q 50/06 702/45 |
| 2009/0192768 | A1* | 7/2009 | Zuo | G01N 33/2823 703/2 |
| 2009/0235731 | A1* | 9/2009 | Zuo | G01N 33/2823 73/152.28 |
| 2010/0250468 | A1* | 9/2010 | Theriot | G06Q 30/0283 705/413 |
| 2010/0305882 | A1* | 12/2010 | Gysling | G01F 1/7082 702/47 |
| 2012/0232859 | A1* | 9/2012 | Pomerantz | G01V 99/005 703/10 |
| 2013/0112406 | A1* | 5/2013 | Zuo | E21B 49/10 166/250.08 |
| 2013/0197808 | A1 | 8/2013 | Zuo et al. | |
| 2013/0289961 | A1* | 10/2013 | Ray | E21B 47/00 703/10 |
| 2013/0304679 | A1* | 11/2013 | Fleming | E21B 43/00 706/14 |
| 2015/0127314 | A1* | 5/2015 | Fleming | G06F 17/5009 703/10 |
| 2015/0134127 | A1* | 5/2015 | Fleming | E21B 43/00 700/282 |
| 2015/0134314 | A1* | 5/2015 | Lu et al. | E21B 43/00 703/10 |
| 2015/0338550 | A1* | 11/2015 | Wadsley | E21B 43/00 703/2 |
| 2016/0042100 | A1* | 2/2016 | Freitas | G01L 9/00 703/2 |
| 2016/0369600 | A1* | 12/2016 | Wong | E21B 41/0092 |
| 2016/0369605 | A1* | 12/2016 | Wong | G06F 17/5009 |
| 2017/0009558 | A1* | 1/2017 | Wong | E21B 43/00 |
| 2017/0091359 | A1* | 3/2017 | Wong | G06F 17/5018 |

OTHER PUBLICATIONS

M.R. Fassihi, AMOCO Production Co., Improved Phase Behavior Representation for Simulation of Thermal Recovery of Light Oils, 1992, 12 Pages, Society of Petroleum Engineers, SPE 24034.

M.L. Litvak, SPE, BP AMOCO, and C.H. Wang, Uni-Tech Consulting Services Inc., Simplified Phase-Equilibrium Calculations in Integrated Reservoir and Surface Pipeline-Network Models, Jun. 2000, 6 pages, SPE Journal, vol. 5, No. 2.

Graham Fleming and Terry Wong/Halliburton, Fully Coupled Simulation of Multiple Compositional Reservoirs with a Shared Surface Facility Network, Feb. 18-20, 2013, 19 Pages, Society of Petroleum Engineers, SPE 163632.

D.V. Voskov, SPE, and H.A. Tchelepi, SPE, Stanford University, Compositional Space Parameterization Theory and Application for Immiscible Displacements, Feb. 26-28, 2007, 10 pages, Society of Petroleum Engineers, SPE 106029.

D.V. Voskov, SPE, and H.A. Tchelepi, SPE, Stanford University, Compositional Space Parameterization: Multicontact Miscible Displacements and Extension to Multiple Phases, Apr. 20-23, 2008, 9 pages, Society of Petroleum Engineers, SPE 113492.

U.S. Appl. No. 61/951,831, filed Mar. 12, 2014, Terry Wong and Graham Christopher Fleming.

* cited by examiner

SIMPLIFIED COMPOSITIONAL MODELS FOR CALCULATING PROPERTIES OF MIXED FLUIDS IN A COMMON SURFACE NETWORK

CROSS-REFERENCE TO RELATED APPLICATIONS

The present application is a U.S. National Stage patent application of International Patent Application No. PCT/US2015/020298, filed on Mar. 12, 2015, which claims the benefit of U.S. Provisional Patent Application No. 61/951,825, filed on Mar. 12, 2014, titled "Procedure for Using Simplified Compositional Models for Calculating Properties of Mixed Fluids in a Common Surface Network," the benefit of both of which are claimed and the disclosure of both of which are incorporated herein by reference in their entirety.

FIELD OF THE DISCLOSURE

The present disclosure relates generally to the recovery of subterranean deposits and more specifically to the recovery of subterranean hydrocarbon deposits from multiple reservoirs through a common surface network.

BACKGROUND

When multiple reservoirs are produced through a common facility network, the capability to integrate the modeling of surface and subsurface can be critical to field development and optimization. The shared facility network imposes constraints that the combined production cannot exceed, determines the pressure drop in the flow lines, and the composition and volume of the sales and reinjection streams. Pressure drop in flow lines is particularly important in deepwater field development, where flow lines are long, and production from multiple reservoirs can flow through the same riser.

Often, the fluid characterizations of these reservoirs have been derived independently. In each case, the appropriate fluid representation was selected that provided an optimum combination of accuracy and computational efficiency. The two most common fluid characterizations are the equation of state (EOS) and the black oil model.

A hydrocarbon fluid may actually be composed of hundreds of distinct components. When modeling using an EOS, the engineer must specify the number of pseudo-components (typically 5 to 12) and their EOS properties. Pseudo-components are combinations of actual components. Alternatively, black-oil modeling involves specification of a number of common engineering measurements in tables that vary with pressure. However, it is inherently a model with two pseudo-components. The net result is that the different connected reservoirs are being modeled with a variable number of pseudo-components, some of which may be common. However, even the common pseudo-components may have different fluid properties in the different reservoirs.

BRIEF DESCRIPTION OF THE DRAWINGS

Illustrative embodiments of the present disclosure are described in detail below with reference to the attached drawing figures.

Figures 1A, 1B:
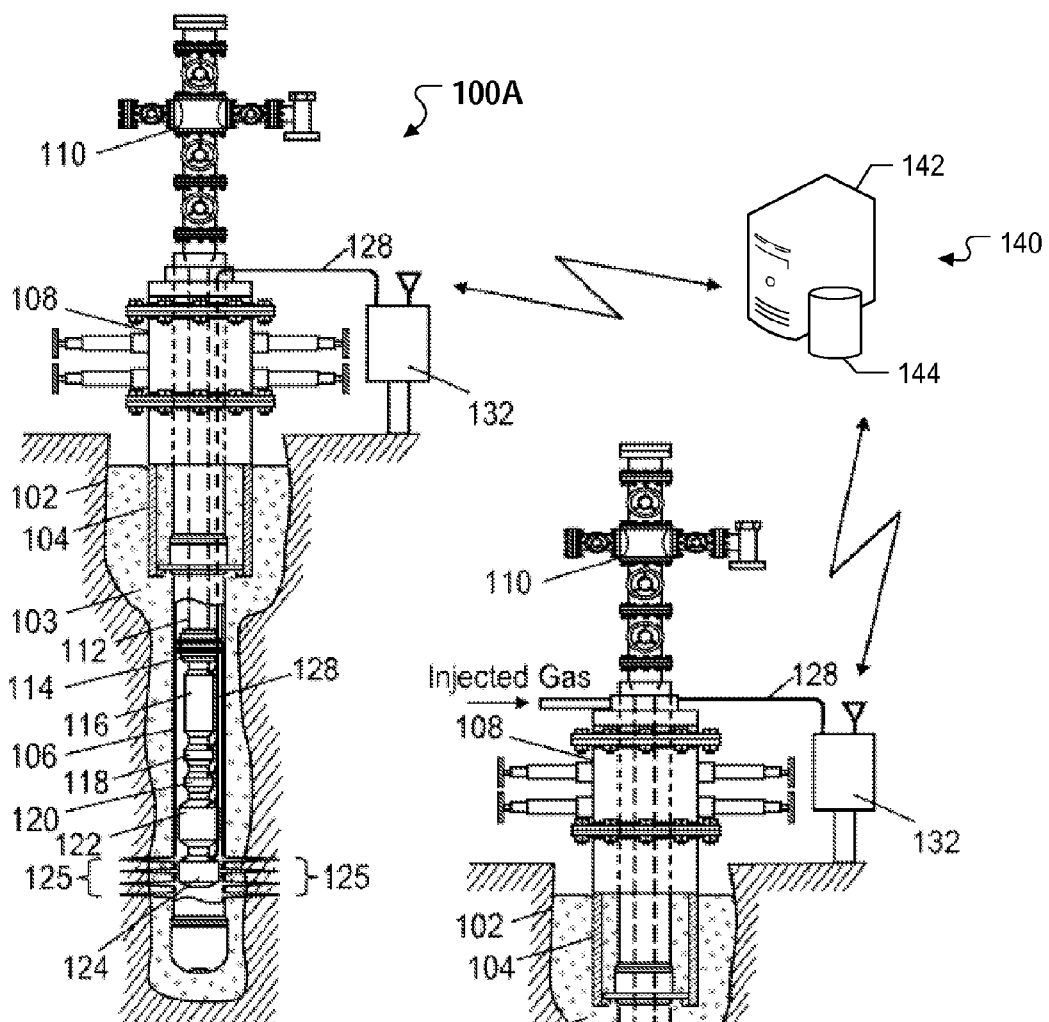
FIGS. 1A and 1B illustrate examples of production wells suitable for hydrocarbon production and exploration from a subsurface reservoir.

The illustrated figures are only exemplary and are not intended to assert or imply any limitation with regard to the environment, architecture, design, or process in which different embodiments may be implemented.

DESCRIPTION OF ILLUSTRATIVE EMBODIMENTS

Embodiments of the present disclosure relate to using simplified compositional models to simulate fluid production and calculate properties of mixed fluids produced in a multi-reservoir system with a common surface network. While the present disclosure is described herein with reference to illustrative embodiments for particular applications, it should be understood that embodiments are not limited thereto. The description of the present disclosure has been presented for purposes of illustration and description, but is not intended to be exhaustive or limited to the embodiments in the form disclosed. Many modifications and variations will be apparent to those of ordinary skill in the art without departing from the scope and spirit of the disclosure. The illustrative embodiments described herein are provided to explain the principles of the disclosure and the practical application thereof, and to enable others of ordinary skill in the art to understand that the disclosed embodiments may be modified as desired for a particular implementation or use. The scope of the claims is intended to broadly cover the disclosed embodiments and any such modification. Any actual data values listed in the detailed description are provided for illustrative purposes only and embodiments of the present disclosure are not intended to be limited thereto. Thus, the operational behavior of embodiments will be described with the understanding that modifications and variations of the embodiments are possible, given the level of detail presented herein.

In the detailed description herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described.

As used herein, the singular forms "a", "an" and "the" are intended to include the plural forms as well, unless the context clearly indicates otherwise. It will be further understood that the terms "comprise" and/or "comprising," when used in this specification and/or the claims, specify the presence of stated features, integers, steps, operations, elements, and/or components, but do not preclude the presence or addition of one or more other features, integers, steps, operations, elements, components, and/or groups thereof. The corresponding structures, materials, acts, and equivalents of all means or step plus function elements in the claims below are intended to include any structure, material, or act for performing the function in combination with other claimed elements as specifically claimed.

The disclosed embodiments and advantages thereof are best understood by referring to the drawings, in which like numerals are used for like and corresponding parts of the various drawings. Other features and advantages of the disclosed embodiments will be or will become apparent to one of ordinary skill in the art upon examination of the following figures and detailed description. It is intended that all such additional features and advantages be included within the scope of the disclosed embodiments. Further, the illustrated figures are only exemplary and are not intended to assert or imply any limitation with regard to the environment, architecture, design, or process in which different embodiments may be implemented.

The disclosed embodiments relate to using equation of state (EOS) compositional models and/or black oil models to simulate fluid production in a multi-reservoir system with a common surface network. As will be described in further detail below, reservoir fluids from multiple hydrocarbon reservoirs may be produced through a common gathering point or shared facility of the common surface network. Thus, heterogeneous fluids from different reservoirs that flow into the common gathering point may combine or mix together. In an example, the disclosed embodiments may be used to calculate properties of the mixed fluids at the common gathering point or other points within the common surface network during a simulation of fluid production in the multi-reservoir system. One example of a reservoir simulator in which the disclosed embodiments may be implemented is the Nexus® integrated reservoir and surface simulator available from Landmark Graphics Corporation of Houston, Tex.

In an embodiment, the simulation may be based in part on production system data including various measurements collected downhole from a well drilled within each hydrocarbon reservoir, e.g., in the form of a production well for an oil and gas reservoir. Further, multiple production wells may be drilled for providing access to the reservoir fluids underground. Measured well data may be collected regularly from each production well to track changing conditions in the reservoir, as will be described in further detail below with respect to the production well examples illustrated in FIGS. 1A and 1B.

FIG. 1A is a diagram of an exemplary production well 100A with a borehole 102 that has been drilled into a reservoir formation. Borehole 102 may be drilled to any depth and in any direction within the formation. For example, borehole 102 may be drilled to ten thousand feet or more in depth and further, may be steered horizontally for any distance through the formation, as desired for a particular implementation. The production well 100A also includes a casing header 104 and a casing 106, both secured into place by cement 103. A blowout preventer (BOP) 108 couples to casing header 104 and a production wellhead 110, which together seal in the well head and enable fluids to be extracted from the well in a safe and controlled manner.

Measured well data may be periodically sampled and collected from the production well 100A and combined with measurements from other wells within a reservoir, enabling the overall state of the reservoir to be monitored and assessed. These measurements may be taken using a number of different downhole and surface instruments, including but not limited to, a temperature and pressure sensor 118 and a flow meter 120. Additional devices may also be coupled in-line to a production tubing 112 including, for example, a downhole choke 116 (e.g., for varying a level of fluid flow restriction), an electric submersible pump (ESP) 122 (e.g., for drawing in fluid flowing from perforations 125 outside ESP 122 and production tubing 112), an ESP motor 124 (e.g., for driving ESP 122), and a packer 114 (e.g., for isolating the production zone below the packer from the rest of well 100A). Additional surface measurement devices may be used to measure, for example, the tubing head pressure and the electrical power consumption of ESP motor 124.

FIG. 1B is a diagram showing an alternative embodiment of the production well 100A of FIG. 1A, which includes many of the same components as well 100A but has been adapted for artificial gas lift. As shown in FIG. 1B, a production well 100B further includes a gas lift injector mandrel 126 in addition to the above-described components of well 100A. In an embodiment, gas lift injector mandrel 126 is coupled in-line with production tubing 112 for controlling a flow of injected gas into a portion of production tubing 112 located above-ground or at the surface of the well near wellhead 110. Although not shown in FIG. 1B, the gas lift production well 100B may also include the same type of downhole and surface instruments as shown for production well 100A in FIG. 1A for providing the above-described measurements.

As shown in FIGS. 1A and 1B, each of the devices along production tubing 112 couples to a cable 128, which may be attached to an exterior portion of production tubing 112. Cable 128 may be used primarily to provide power to the devices to which it couples. Cable 128 also may be used to provide signal paths (e.g., electrical or optical paths), through which control signals may be directed from the surface to the downhole devices as well as telemetry signals from the downhole devices to the surface. The respective control and telemetry signals may be sent and received by a control unit 132 at the surface of the production well. Control unit 132 may be coupled to cable 128 through blowout preventer 108. In an embodiment, field personnel may use control unit 132 to control and monitor the downhole devices locally, e.g., via a user interface provided at a terminal or control panel integrated with control unit 132. Additionally or alternatively, the downhole devices may be controlled and monitored by a remote processing system 140. Processing system 140 may be used to provide various supervisory control and data acquisition (SCADA) functionality for the production wells associated with each reservoir in a field. For example, a remote operator may use processing system 140 to send appropriate commands for controlling wellsite operations to control unit 132. Communication between control unit 132 and processing system 140 may be via one or more communication networks, e.g., in the form of a wireless network (e.g., a cellular network), a wired network (e.g., a cabled connection to the Internet) or a combination of wireless and wired networks.

As shown in FIGS. 1A and 1B, processing system 140 may include a computing device 142 (e.g., a server) and a data storage device 144 (e.g., a database). Although only one computing device and one data storage device are shown in FIGS. 1A and 1B, it should be appreciated that processing system 140 may include additional computing devices and data storage devices. Computing device 142 may be implemented using any type of computing device having at least one processor, a memory and a networking interface capable of sending and receiving data to and from control unit 132 via a communication network. In an embodiment, computing device 142 may be a type of server. Examples of such a server include, but are not limited to, a web server, an application server, a proxy server, and a network server. In some implementations, computing device 142 may represent a group of computing devices in a server farm.

In an embodiment, control unit 132 may periodically send wellsite production data via a communication network to processing system 140 for processing and storage. Such wellsite production data may include, for example, production system measurements from various downhole devices, as described above. In some implementations, such production data may be sent using a remote terminal unit (RTU) of control unit 132. In an embodiment, data storage device 144 may be used to store the production data received from control unit 132. In an example, data storage device 144 may be used to store historical production data including a record of actual and simulated production system measurements obtained or calculated over a period of time, e.g., multiple simulation time-steps, as will be described in further detail below.

While production wells 100A and 100B are described in the context of a single reservoir, it should be noted that the embodiments disclosed herein are not limited thereto and that the disclosed embodiments may be applied to fluid production from multiple reservoirs in a multi-reservoir production system with a common surface or gathering network, as will be described in further detail below with respect to FIG. 3. Thus, a plurality of surface control units similar to control unit 132 may be used to send production system data from the respective wellsites of different reservoirs in the production system to processing system 140. In addition to the above-described SCADA functionality, processing system 140 may be used to process the received data and simulate fluid production in the multi-reservoir system, as will be described in further detail below.

Figure 2:
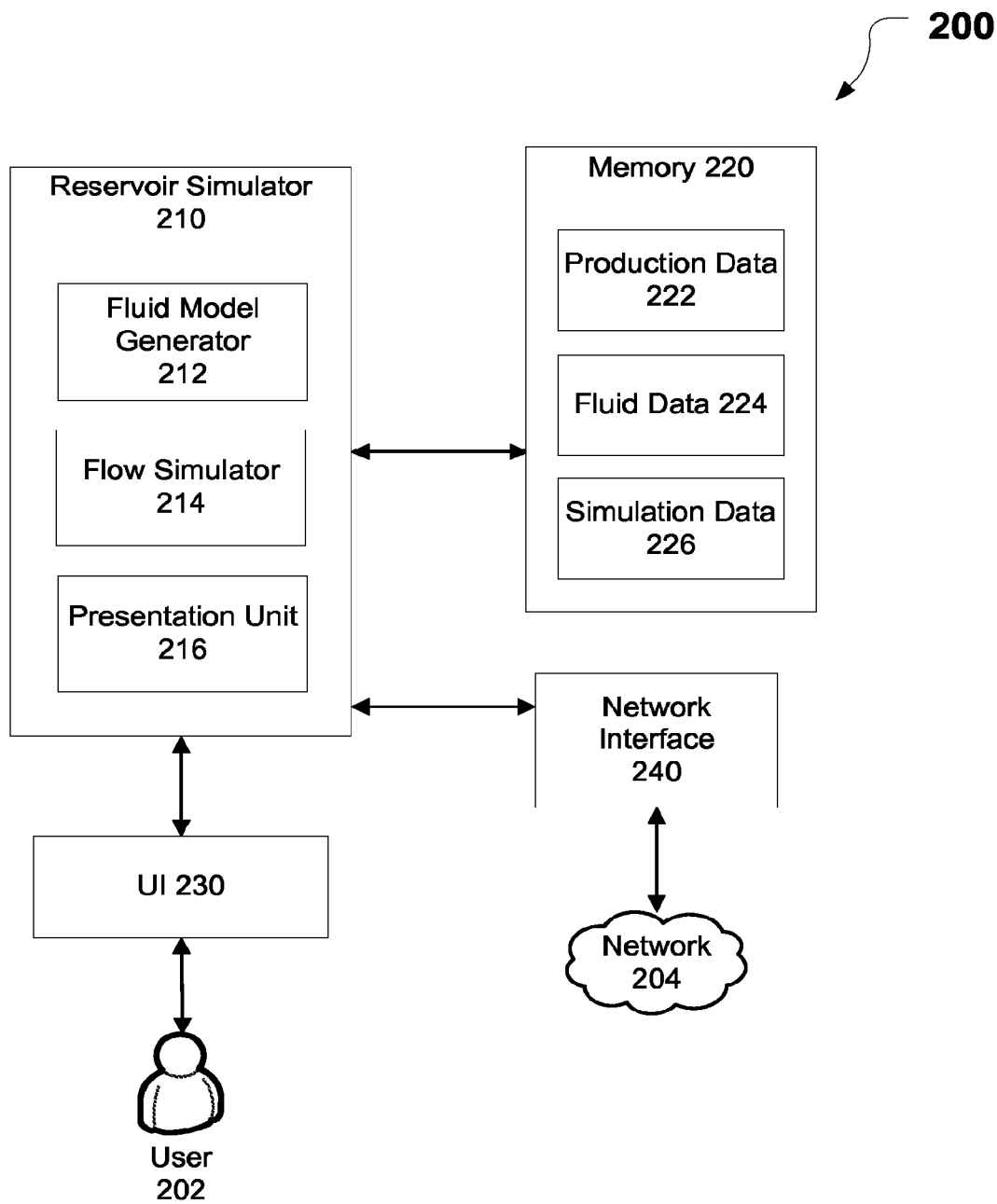
FIG. 2 is a block diagram of an exemplary system for simulating fluid production in a multi-reservoir system with a common surface network.

FIG. 2 is a block diagram of an exemplary system 200 for simulating fluid production in a multi-reservoir system. For example, system 200 may be used to implement a processing system, e.g., processing system 140 of FIGS. 1A and 1B, as described above, for processing wellsite data sent by a surface control unit (e.g., control unit 132 of FIGS. 1A and 1B) of a production well associated with each reservoir in the production system. As shown in FIG. 2, system 200 includes a reservoir simulator 210, a memory 220, a user interface (UI) 230 and a network interface 240. Reservoir simulator 210 includes a fluid model generator 212, a flow simulator 214 and a data presentation unit 216. In an embodiment, reservoir simulator 210 and its components (including fluid model generator 212, flow simulator 214 and presentation unit 216), memory 220, UI 230 and network interface 240 may be communicatively coupled to one another via an internal bus of system 200.

In an embodiment, system 200 can be implemented using any type of computing device having at least one processor and a processor-readable storage medium for storing data and instructions executable by the processor. Examples of such a computing device include, but are not limited to, a desktop computer, a workstation, a server, a cluster of computers (e.g., in a server farm) or similar type of computing device. Such a computing device may also include an input/output (I/O) interface for receiving user input or commands via a user input device (not shown). The user input device may be, for example and without limitation, a mouse, a QWERTY or T9 keyboard, a touch-screen, a graphics tablet, or a microphone. The I/O interface may also include a display interface for outputting or presenting information on a display (not shown) coupled to or integrated with the computing device.

While only reservoir simulator 210, memory 220, UI 230 and network interface 240 are shown in FIG. 2, it should be appreciated that system 200 may include additional components, modules, and/or sub-components as desired for a particular implementation. It should also be appreciated that reservoir simulator 210 and its components may be implemented in software, firmware, hardware, or any combination thereof. Furthermore, it should be appreciated that embodiments of reservoir simulator 210, or portions thereof, can be implemented to run on any type of processing device including, but not limited to, a computer, workstation, embedded system, networked device, mobile device, or other type of processor or computer system capable of carrying out the functionality described herein.

In an embodiment, system 200 may use network interface 240 to communicate with different devices and other systems via a network 204. Network 204 can be any type of network or combination of networks used to communicate information between different computing devices. Network 204 can include, but is not limited to, a wired (e.g., Ethernet) or a wireless (e.g., Wi-Fi or mobile telecommunications) network. In addition, network 204 can include, but is not limited to, a local area network, medium area network, and/or wide area network such as the Internet.

In an embodiment, system 200 may use network interface 240 to send and receive information to and from a wellsite control and monitoring device, e.g., surface control unit 132 of FIGS. 1A and 1B, as described above, via network 204. Such information may include, for example, production system data sent from the wellsite control and monitoring device to system 200 via network 204. Likewise, various control signals and commands may be sent by system 200 to the wellsite control and monitoring device via network 204, e.g., for purposes of controlling wellsite operations or requesting wellsite production system data from the device. In some implementations, such control signals may be in the form of telemetry signals sent using a telemetry transceiver integrated within network information 240 of system 200.

In an embodiment, the control signals or commands sent by system 200 to the device at the wellsite may be based on input received from a user 202 via UI 230. User 202 may interact with UI 230 via a user input device (e.g., a mouse, keyboard, or touch-screen) and a display coupled to system 200 to configure, control or monitor the execution of production system simulation. In accordance with user input received by reservoir simulator 210 via UI 230, production system data may be requested and received from a wellsite control and monitoring device via network 204, as described above. The data received from the device may be processed and used by reservoir simulator 210 in the production system simulation. The results of the simulation may then be presented by presentation unit 216 to user 202 via UI 230.

In an embodiment, memory 220 may be used to store the production system data from the device in the above example in addition to various other types of data accessible by reservoir simulator 210 and its components (including fluid model generator 212, flow simulator 214 and presentation unit 216) for implementing the production system simulation functionality disclosed herein. Memory 220 can be any type of recording medium coupled to an integrated circuit that controls access to the recording medium. The recording medium can be, for example and without limitation, a semiconductor memory, a hard disk, or similar type of memory or storage device. In some implementations, memory 220 may be a remote cloud-based storage location accessible to system 200 via network interface 240 and network 204.

In the example shown in FIG. 2, the data stored in memory 220 may include production data 222, fluid data 224 and simulation data 226. As will be described in further detail below, reservoir simulator 210 may use a combination of production data 222, fluid data 224 and simulation data 226 to derive a desired set of operating points for a given time-step of the production system simulation.

Production data 222 may include, for example, actual and/or simulated production system measurements. Actual production system measurements may include, for example, surface and downhole well measurements from various production wells in the multi-reservoir system. Such measurements may include, but are not limited to, pressure, temperature and fluid flow measurements taken downhole near the well perforations, along the production string, at the wellhead and within the gathering network prior to the point where the fluids mix with fluids from other reservoirs. Likewise, the simulated measurements may include, for example and without limitation, estimates of pressure, temperature and fluid flow. Such estimates may be determined based on, for example, simulation results from one or more previous time-steps.

Fluid data 224 may represent different reservoir fluid components (e.g., heavy crude, light crude, methane, etc.) and related properties including, for example, their proportions, fluid density and viscosity for various compositions, pressures and temperatures, or other data. In an embodiment, fluid data 224 may include black oil and/or EOS model data, e.g., in the form of one or more data tables, representing the fluids of each reservoir within the multi-reservoir production system.

In an embodiment, fluid model generator 212 may generate a fluid model for each reservoir in the multi-reservoir system based on corresponding production data 222 and fluid data 224. For example, fluid model generator 212 may determine parameters for each fluid component or group of components of the reservoir based on actual and simulated production system measurements (e.g., from one or more prior simulation time-steps) and fluid component characterizations associated with each reservoir. The resulting model for each component/group can then be applied to known state variables to calculate unknown state variables at each simulation point or "gridblock" within the reservoir, at the wellbore perforations or "sandface," and within the common gathering network of the production system. These unknown variables may include, for example and without limitation, each gridblock's liquid volume fraction, solution gas-oil ratio and formation volume factor.

In an embodiment, the resulting fluid component state variables, both measured and calculated, may be provided as inputs to flow simulator 214 for simulating the flow of fluids through the multi-reservoir production system. Additional inputs to flow simulator 214 may include, for example, various floating parameters, fixed parameters and characterization data related to the production system and constraints thereof. The floating parameters may include, for example, various enhanced oil recovery (EOR) parameters including, but not limited to, gas lift injection rates, reservoir gas injection rates and reservoir liquid injection rates. Examples of fixed parameters may include facility constraints (e.g., a production capacity limit) and default production rates for individual wells. Reservoir characterization data may include, for example, geological data describing reservoir formations (e.g., log data previously collected during drilling and/or prior logging of the well) and formation characteristics (e.g., porosity). The above-described fluid component state variables along with the other simulation inputs, parameters and production system constraints may be stored in memory 220 as simulation data 226.

In an embodiment, flow simulator 214 may employ set of a fully-coupled equations to perform the simulation and determine optimal operating settings for the production system such that production of the reservoirs can be maximized over time without exceeding any facility constraints. The equations are characterized as "fully-coupled" because all the equations for all the reservoirs and the gathering network may be solved simultaneously, rather than solving the reservoir and gathering network separately and iterating between the reservoir and gathering network solutions to determine appropriate boundary conditions for each set of equations (i.e., loosely-coupled).

In an embodiment, the fully-coupled equations may be used with any of various numerical analysis techniques (e.g., a Newton-Raphson method) to determine a set of mass and/or volume balance values for each gridblock. The equations also may be used to determine the flow of fluids through the production system and provide a solution that includes operating settings that honor the various production system constraints, e.g., one or more facility constraints, gathering network constraints, well constraints, or reservoir constraints. Further, the equations may be used by flow simulator 214 to determine updated fluid properties (e.g., updated fluid component mass and volume values for each gridblock) at the end of the simulation time-step. At least some of the updated parameters may be provided, for example, as previous time-step data for subsequent simulation time-steps. In addition, the simulation performed by flow simulator 214 may be repeated for each of a plurality of different time-steps, where the simulation results for a given time-step are used to update the simulation for the next time-step.

With the state of the fluids known throughout the production system, the flow of fluid can be simulated using mass/volume balance equations representative of the reservoir, of perforations in the wellbore and of the gathering network. In an embodiment, the facility equations representing the gathering network include molar balance equations at the nodes, hydraulic equations, constraint equations, and composition equations. The independent variables for the facility equations include pressure and composition for the nodes, and molar flow rates for the connections.

The full system of equations can be expressed as follows:

$$\begin{bmatrix} A_{rr} & & A_{rf} \\ A_{pp} & A_{pf} \\ A_{fp} & A_{ff} \end{bmatrix} \begin{bmatrix} \delta x_r \\ \delta x_p \\ \delta x_f \end{bmatrix} = - \begin{bmatrix} R_r \\ R_p \\ R_f \end{bmatrix} \qquad (1)$$

where R denotes the residuals, and A the Jacobian for a Newton iteration of the production system simulation. A contains the derivatives of the residuals with respect to the variables x, where $x_r$ includes gridblock moles and pressures, $x_p$ includes perforation flow rates, and $x_f$ includes facility node compositions and pressures and the total molar flow rate of the facility connections. The first row of equations represents the reservoir equations (simulating fluid flow through the reservoir), the second row represents the perforation equations (simulating fluid flow through the perforations), and the third row represents the facility equations (simulating fluid flow through the gathering network).

In an embodiment, the reservoir equations include molar balance equations of the form:

$$R_{ri} = F_i^{in} - F_i^{out} - a_i + G_i - \Sigma_{p \in p_r} Q_{rpi} \qquad (2)$$

where the residual $R_{ri}$ of component i for each reservoir gridblock r is driven to zero at full convergence of the equations. For component i, $F_i^{in}$ and $F_i^{out}$ are the molar flow rates across reservoir gridblock faces, $a_i$ is the rate of accumulation, $G_i$ is the rate of generation and $Q_{rpi}$ is the perforation flow rate (positive for production, negative for injection) between a reservoir gridblock r and a wellbore through perforation p. The $Q_{rpi}$ are summed over the perforations within gridblock r. The independent variables are the mass (in moles) of each component i, and the gridblock pressure. In addition to the molar balance equations, in at least some illustrative embodiments a volume balance equation operates to constrain the pore volume so that it equals the fluid volume. This can be written in residual form as:

$$R_{r,nc_r+1} = V_{Pr} - V_{Fr} \qquad (3)$$

where $nc_r$ is the number of reservoir pseudo-components, $V_{Pr}$ is the pore volume and $V_{Fr}$ is the fluid volume for gridblock r.

In at least some illustrative embodiments, the perforation equations are expressed as flow equations for each perforation within a reservoir gridblock. Starting with the simpler case of a single reservoir and a gathering network with the same number of pseudo-components, the perforation equation for producing perforations can be expressed using the flow equation, $$Q_{rpi} = C_p \Delta \Phi_p \sum_{m=1}^{Nphases} \frac{krel_{rm}}{\mu_{rm}} \rho_{rm} z_{rmi} \qquad (4)$$

where $Q_{rpi}$ is the perforation flow rate of fluid pseudo-component i for perforation p within gridblock r, $C_p$ is the wellbore constant (equal to the well index multiplied by the permeability-thickness product), $\Delta \Phi_p$ is the permeability-thickness product (i.e., the potential difference from the reservoir to the wellbore for perforation p), and where for phase m within gridblock r, $krel_{rm}$ is the relative permeability, $\mu_{rm}$ is the viscosity, $\rho_{rm}$ is the density, and $z_{rmi}$ is the mole fraction of fluid pseudo-component i. Similarly, the perforation equation for injecting perforations can be expressed using the flow equation, $$Q_{rpi} = C_p \lambda_p^{inj} \rho_p^{inj} \Delta \Phi_p z_{rpi} \qquad (5)$$

where $\lambda_p^{inj}$ is the fluid mobility (e.g., the sum of the gridblock phase mobilities or an endpoint mobility), $\rho_p^{inj}$ is the perforation-injected fluid density, and $z_{rpi}$ is the component mole fraction at a node in the wellbore.

The above-described simulation assumes a configuration of the production system in which multiple reservoirs are coupled to a common surface or gathering network. Such a gathering network may include, for example, a plurality of nodes with connections between the nodes and various reservoir gridblocks. Nodes may represent physical locations of relevant components or devices (e.g., separator 310 of FIG. 3, as will be described below) within the gathering network and/or the production wells of various reservoirs. Connections may represent pipes or flow control devices, for example, pumps, compressors, valves, or similar types of devices. An example of such a production system configuration is shown in FIG. 3.

Figure 3:
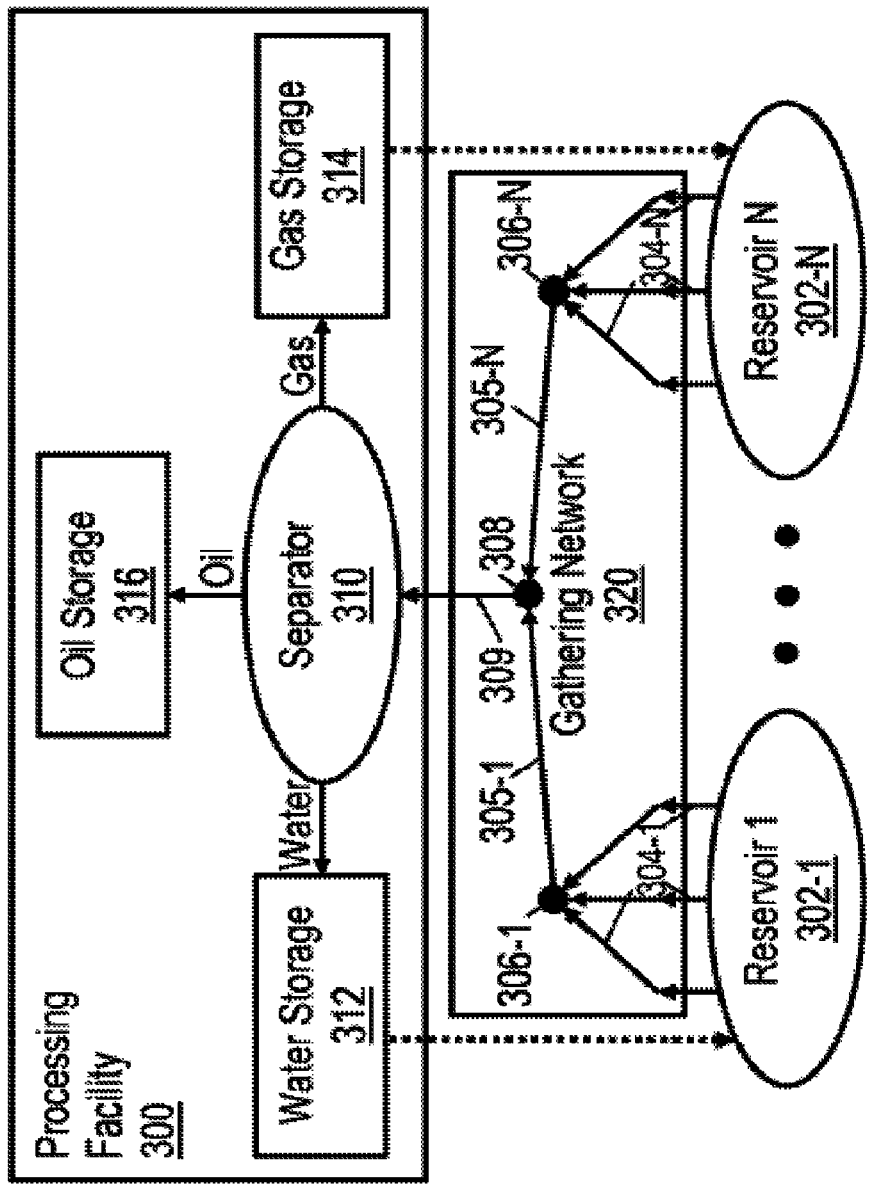
FIG. 3 is a diagram illustrating an exemplary of a multi-reservoir system with a common surface network.

FIG. 3 is a diagram illustrating an exemplary multi-reservoir system including a common surface or gathering network. As shown in FIG. 3, a group of N reservoirs 302-1 through 302-N are coupled together through a gathering network 320. Individual well lines 304 (1 through N) from each well couple to a corresponding reservoir node 306 (1 through N), with each node coupling through a reservoir line 305 (1 through N) to a common node 308. Common node 308 may provide, for example, mixed fluids produced from reservoirs 302-1 to 302-N through riser 309 to a processing facility 300. The mixed fluids that are produced at common node 308 through riser 309 may include fluids produced from any number of reservoirs 302-1 to 302-N, for example, all of the reservoirs or any subset thereof. In the example shown, processing facility 300 includes a separator 310 that receives the mixed product from facility riser 309 and separates the product into water, oil and gas. These separated products are respectively stored in water storage 312, oil storage 316 and gas storage 314 for later use and/or delivery further downstream (e.g., to a refining facility). Alternatively, some of the separated product may be used to assist with the removal of product from the reservoir. For example, a portion of the separated gas and/or water may be reinjected into one or more reservoirs as part of an enhanced oil recovery (EOR) operation, as indicated by the dashed arrows in FIG. 3.

Maximizing fluid production in the multi-reservoir production system of FIG. 3 may involve controlling the production of each individual well such that the combined production of the wells, or a selected group of the wells, provides the greatest possible amount of hydrocarbon (e.g., oil and/or gas) production within the operating limits of processing facility 300 and without exceeding any production system constraints. In an embodiment, optimal well operating points that maximize fluid production over time and enable processing facility 300 to operate within its limits may be determined from the results of a simulation of fluid production in the multi-reservoir system. For example, reservoir simulator 210 of FIG. 2, as described above, may be used to identify the optimal well operating points from a simulation of fluid production in the multi-reservoir system of FIG. 3 based on production system measurements, reservoir characterizations and constraints related to reservoirs 302-1 to 302-N and processing facility 300. In some implementations, such operating points may be expressed as a solution to a simultaneous set of fully-coupled equations, as described above.

In addition to using simulation results to determine optimal well operating points and maximize fluid production in the multi-reservoir system, a reservoir engineer (e.g., user 202 of reservoir simulator 210 of FIG. 2) might be interested in improving the computational efficiency of the simulation itself and the accuracy of the simulation results. As will be described in further detail below, the fluid modeling and production simulation techniques disclosed herein may allow such improvements to be achieved for the simulation by using a modified or simplified compositional model representing the mixed fluids produced from the multiple reservoirs of the above-described multi-reservoir production system.

Referring to FIG. 3, each of reservoirs 302-1 to 302-N may be associated with an EOS model, e.g., in the form of one or more EOS data tables, representing the fluids within that reservoir. In this example, each reservoir may have at least two fluid components, e.g., an oil component and a gas component, which can be produced into gathering network 320. In an embodiment, it may be assumed for purposes of the simulation that the gas components of reservoirs 302-1 to 302-N are identical while the oil components maintain their separate identities for each reservoir. However, it should be noted that the gas components also may retain their separate identities in some implementations, e.g., for more flexibility when dealing with condensate reservoirs.

As will be described in further detail below with respect to the process shown in FIG. 4, an EOS characterization of reservoir fluids may be used to produce an EOS model for each of a plurality of reservoirs within the multi-reservoir system. Additionally, some of the reservoir fluids may be represented by black oil models. In this case, an additional step is required to transform the black oil models to EOS models so that for each reservoir the basis of the mixing will be the mixing of EOS models. While the EOS models for the reservoirs in the multi-reservoir system may have at least some light components in common, the disclosed embodiments do not require the EOS model for each reservoir to have the same EOS components as in conventional approaches, which utilize a master EOS model with a component set that can be expanded from the component sets of individual reservoirs. The EOS model in accordance with the disclosed embodiments may have at least one heavy component, also referred to herein as a "marker component," that is unique to each reservoir in the multi-reservoir system. Further, while the embodiments disclosed herein may perform delumping, the delumping is performed without using full EOS modeling for calculating the fluid properties of the mixed fluid. Instead, the disclosed embodiments use the marker component to generate property tables as a function of pressure and the marker component.

Figure 4:
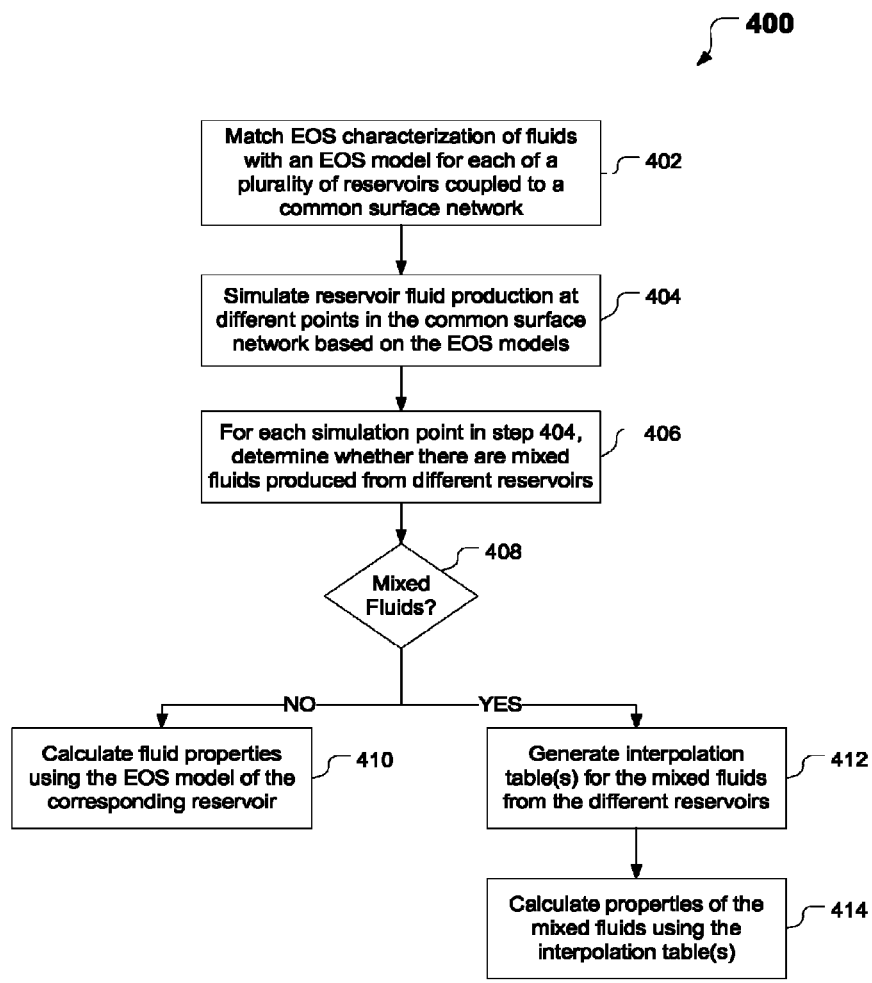
FIG. 4 is a flowchart of an exemplary method of using EOS compositional models to simulate fluid production and calculate properties of fluids produced in a multi-reservoir system with a common surface network.

FIG. 4 is a flowchart of an exemplary method 400 of using a simplified compositional model for determining the properties of mixed fluids produced in a multi-reservoir system having a common surface network. For discussion purposes, method 400 will be described using the above-described multi-reservoir system of FIG. 3 but is not intended to be limited thereto. As shown in FIG. 4, method 400 includes steps 402, 404, 406, 408, 410, 412 and 414. However, it should be noted that method 400 may include additional steps to perform the techniques disclosed herein, as desired for a particular implementation. The steps of method 400 may be implemented by, for example, reservoir simulator 210 of FIG. 2, as described above, but method 400 is not intended to be limited thereto.

Method 400 begins in step 402, which includes matching an EOS characterization of fluids with an EOS model for each of a plurality of reservoirs (e.g., reservoirs 302-1 to 302-N of FIG. 3) in the multi-reservoir system. The EOS model for each reservoir may represent different components of the reservoir's fluids in their EOS form. The different fluid components represented by the EOS model for each reservoir may include, for example, one or more light fluid components that are common across all of the reservoirs in the production system and at least one heavy fluid component (or marker component) that is unique to each reservoir. In an embodiment, the common light fluid components may be gas components and the unique heavy oil component may be an oil component.

Method 400 then proceeds to step 404, in which fluid production in the multi-reservoir system may be simulated at different points in the common surface network. The simulation points may correspond to, for example, different nodes (e.g., nodes 306-1 to 306-N of FIG. 3) in the common surface network, as described above. In step 406, it is determined for each simulation point in step 404 whether there are mixed fluids produced from different reservoirs. In step 408, the results of the determination in step 406 may be used to decide whether method 400 will proceed to step 410 or step 412. In an example, if it is determined in step 406 that the fluids at a particular simulation point in the network are produced from only a single reservoir, method 400 may proceed from step 408 to step 410. Step 410 may include calculating fluid properties using the EOS model (from step 402) corresponding to the reservoir from which the fluids are produced.

Alternatively, if it is determined in step 406 that there is a commingling or mixing of fluids from different reservoirs at the particular simulation point in question, method 400 may proceed from step 408 to step 412. Step 412 includes generating one or more interpolation tables representing the mixed fluids produced from the different reservoirs via the common surface network, based on the corresponding EOS model for each of the different reservoirs. In an embodiment, the interpolation tables may be generated as a function of pressure and the marker components of the different reservoirs in this example. In step 414, the generated interpolation tables from step 412 may be used to calculate the properties of the mixed fluids.

In an embodiment, the mixed fluid properties may be calculated by performing a table look-up using any of various table look-up techniques based on the marker component and the one or more interpolation tables. A benefit of using such table look-up techniques is that the interpolation tables generated in step 412 may be used in place of phase equilibrium calculations, which can often be the most expensive part of phase behavior calculations for the mixed fluids. For example, the interpolation tables may provide a simplified compositional model that can be used to replace the equilibrium flash calculations associated with conventional phase behavior calculation techniques. The phase splits of the mixed fluids may be determined using such a simplified flash replacement, and a standard EOS based table look-up technique may be used to calculate the individual phase properties. Examples of such EOS flash replacement techniques that may be used include, but are not limited to:

1) use of compositionally dependent K-value calculations in which K-values are tabulated as functions of pressure, temperature and the composition of one or more components including, for example, one or more marker components, and the K-values are used to determine the phase equilibrium while phase properties are calculated using standard EOS techniques;

2) use of EOS interpolation techniques for simplified phase equilibrium calculations in which saturation pressure, K-values at the saturation pressure, liquid and vapor compressibility factors are tabulated as functions of pressure, temperature, and the composition of some of the components including the marker components while EOS calculations may be used to determine other fluid properties; and 3) use of the interpolation tables as a function of compositional tie-lines relating oil and gas compositions.

In the latter technique, the phase mole fractions and the phase compositions may be tabulated as a function of pressure, temperature and overall component compositions. Then, standard EOS techniques may be used to calculate other phase properties. Some or all of the components may be included, e.g., as interpolants, in addition to all of the marker components.

The disclosed embodiments will now be further described using the following examples of possible data structures that may be defined for the individual reservoirs and for the mixed fluid models described above.

For example, Table 1 below shows the black oil data for a reservoir 1. The black oil data in Table 1 may provide, for example, a black oil model description of the fluids in reservoir 1, which can be input to a reservoir simulator, e.g., reservoir simulator 210 of FIG. 2, as described above, for performing the simulation. As shown in Table 1 below, the main data columns of this input table may be for the pressure (in psia), the solution gas oil ratio (Rs) in units of MSCF/STB, and the oil formation volume factor (Bo) in units of STB/RB. While only these three main columns are shown below, it should be noted that embodiments are not intended to be limited thereto and that the table may have additional columns representing other black oil data parameters including, for example and without limitation, gas FVF, solution gas-oil ratio, oil viscosity, and gas viscosity. Additionally, undersaturated data may be associated with at least one of the pressures.

TABLE 1

Original Black Oil Model Data for Reservoir 1

| Pressure (psia) | Rs (MSCF/STB) | Bo (STB/RB) |
|---|---|---|
| 3000 | 1.2 | 1.3 |
| 2000 | 0.8 | 1.2 |
| 1000 | 0.4 | 1.1 |
| 14.7 | 0.00001 | 1 |

Table 2 below shows the fluid component properties for a reservoir 2, as represented by an EOS model of the reservoir's fluids. As shown below, Table 2 may include data columns for key fluid properties of interest during the simulation including, for example and without limitation, molecular weight, critical temperature, and critical pressure. It should be noted that the table for a full EOS model description may include additional columns of data, for example, columns for an acentric factor, critical volume, parachors, and volume translation factors for each component. A separate table of interaction coefficients may also be used.

TABLE 2

EOS Model Data for Reservoir 2

| Component Name | Molecular weight | Critical temperature (R) | Critical pressure (psia) |
|---|---|---|---|
| P1 | 18 | 300 | 550 |
| P2 | 35 | 549.8 | 850 |
| P3 | 44.1 | 665.7 | 616.3 |
| P4 | 65 | 820 | 485 |
| P5 | 90 | 950. | 438. |
| P6 | 200 | 1200 | 255 |

In an embodiment, an EOS characterization of the mixed fluids from different reservoirs may be generated. Such an EOS characterization may include, for example, a set of light components ($CO_2$, $N_2$, $H_2S$, C1, C2, C3, iC4, nC4, iC5, nC5, C6) and a set of common heavy components (HC1, HC2), two heavy component(s) exclusive to reservoir 1 (R1H1 and R1H2), and at least one heavy component that is exclusive to a reservoir 2 (R2H1). The actual number of light components may be the same, but the number of heavy components may be specific to a particular implementation. The process performs a characterization procedure as described in step 1 above.

In one example, a common EOS model may be generated based on a set of reservoir pseudo-components defined using common pseudo-components that overlap between reservoirs 1 and 2. Each of the "pseudo-components" may represent, for example, any number of real fluid components that are grouped together or "lumped" into a single component that can be processed as an individual unit. The use of overlapping common pseudo-components may enable the application of fully-coupled mass/volume balance equations to multiple reservoirs, wells and the gathering network using a larger but still relatively small number of common pseudo-components (e.g., less than the total of all the reservoir pseudo-components). The common pseudo-components represent a common fluid characterization that includes sufficient components to represent the behavior of multiple fluids in different reservoirs.

The common characterization in this example may be based on an expression of the components as common pseudo-components that are defined based on the components' bulk hydrocarbon composition or carbon number up to C45. The set of light components $CO_2$, $N_2$, $H_2S$, CI, C2, C3, nC4, iC4, nC5, iC5 and C6 may be used with their commonly accepted properties, while the C7+ heavy components are defined using a probability distribution function that provides the molecular weight and mole fraction for each carbon number from C7 to C45. It should be appreciated that any of various techniques may be used to define the C7+ heavy components. Once a set of molecular weights and mole fractions are established, a Watson or other type of characterization factor may be calculated for each common pseudo-component, which in turn may be used to calculate the specific gravity of each common pseudo-component. It should be appreciated that any of various techniques may be used to calculate pseudo-component specific gravities and/or other pseudo-component characteristics will become apparent to those of ordinary skill in the art, and all such techniques are within the scope of the present disclosure. The true boiling point (TBP) for each common pseudo-component may also be calculated. The molecular weights, TBPs and specific gravities can be combined using any of a number of correlation techniques to calculate the critical properties needed by the fluid models. Non-zero interaction coefficients may also need to be estimated through correlations.

At this stage, a large number of pseudo-components may be used, far larger than the usual number normally used to simulate reservoir and network systems. In order to improve computational efficiency, the components are lumped together in a pseudoization process. For example, in this case the heavy components of reservoir 1arc lumped together into two pseudo-components R1H1 and R1H2, while the heavy components of reservoir 2 are lumped together into pseudo-component R2H1.

The critical properties and the interaction coefficients generated in the above manner may need to be adjusted to adequately match the fluid properties for each reservoir. Regression methods may be applied to adjust the values of the fluid parameters.

For calculations of commingled fluids, the extra step of mixing or weaving components from the two EOS models is carried out. In this case, the two EOS models share the same light components and light component properties so only the compositions of the light components in the mixture needs to be adjusted. Using simple weaving, we retain the heavy components R1H1 and R1H2 from reservoir 1, and R2H2 from reservoir 2. The mole fractions are adjusted during the mixing step.

The EOS model based on the above-described fluid component characterizations may be represented using a data table similar to Table 3 below, which may be provided as input to a reservoir simulator (e.g., reservoir simulator 210 of FIG. 2, as described above).

TABLE 3

EOS Model Data for Mixed Fluids from Different Reservoirs

| Component Name | Molecular weight | Critical temperature (R) | Critical pressure (psia) |
|---|---|---|---|
| CO2 | 44.01 | 547.6 | 1070.9 |
| N2 | 28.01 | 227.3 | 493.0 |
| H2S | 34.08 | 212.7 | 1036.0 |
| C1 | 16.043 | 343.0 | 667.8 |
| C2 | 30.07 | 549.8 | 707.8 |
| C3 | 44.1 | 665.7 | 616.3 |
| iC4 | 58.12 | 734.7 | 529.1 |
| nC4 | 58.12 | 765.3 | 550.7 |
| iC5 | 72.15 | 828.8 | 490.4 |
| nC5 | 72.15 | 845.4 | 488.6 |
| C6 | 86.18 | 913.4 | 436.9 |
| HC1 | 98.55 | 1004.4 | 441.5 |
| HC2 | 319.83 | 1490.2 | 191.1 |
| R1H1 | 135.84 | 1135.1 | 362.7 |
| R1H2 | 206.25 | 1309.6 | 266.9 |
| R2H1 | 500.0 | 1670.4 | 140.3 |

The EOS model may then be used to generate tables of compositional calculations in which values are tabulated as a function of pressure, temperature and compositions, e.g., in the form of one or more interpolation parameters. It is possible that only some of the components may be required as interpolants, in which case the marker components may be targeted to be the interpolants. For example, in one embodiment, in the above-described example of mixed fluids from two different reservoirs, at least one of the unique "marker" components that is specific to one of the reservoirs, e.g., R1H1, may be selected as the interpolation parameter. Tables 4-6 below are examples of generated tables for different values of the interpolation parameter, e.g., the marker component (R1H1) in this example. The composition of the respective oil and gas phases in each table may be expressed, for example, as a list of 15 numbers corresponding to the values of the remaining components, i.e., excluding R1H1, as shown in Table 3 above. Depending on the calculation mechanism, alternative data such as K-values or phase Z-factors may be tabulated instead of the compositions and phase fractions.

TABLE 4

Mole fraction R1H1 = 0

| Pressure | Fraction of gas phase | Composition of gas phase (a list of 15 numbers that sum to 1.) | Composition of oil phase (a list of 15 numbers that sum to 1.) |
|---|---|---|---|
| 3000 | 0.01 | (0.02, 0.005, 0.0005, 0.52, . . . , 0.015) | (0.002, 0.0003, 0.00003, 0.2, . . . , 0.125) |
| 2000 | 0.22 | (0.02, 0.0048, 0.00052, 0.533, . . . , 0.0166) | (0.002, 0.0003, 0.00003, 0.19, . . . , 0.135) |
| 1000 | 0.35 | (0.02, 0.0048, 0.00052, 0.543, . . . , 0.0173) | (0.002, 0.0003, 0.00003, 0.19, . . . , 0.127) |

TABLE 5

Mole fraction R1H1 = 0.5

| Pressure | Fraction of gas phase | Composition of gas phase (a list of 15 numbers that sum to 1) | Composition of oil phase (a list of 15 numbers that sum to 1.) |
|---|---|---|---|
| 3000 | 0.015 | (0.02, 0.005, 0.0005, 0.52, . . . , 0.015) | (0.002, 0.0003, 0.00003, 0.2, . . . , 0.125) |
| 2000 | 0.27 | (0.02, 0.0048, 0.00052, 0.533, . . . , 0.0166) | (0.002, 0.0003, 0.00003, 0.19, . . . , 0.135) |
| 1000 | 0.37 | (0.02, 0.0048, 0.00052, 0.543, . . . , 0.0173) | (0.002, 0.0003, 0.00003, 0.19, . . . , 0.127) |

TABLE 6

Mole fraction R1H1 = 1.0

| Pressure | Fraction of gas phase | Composition of gas phase (a list of 15 numbers that sum to 1.) | Composition of oil phase (a list of 15 numbers that sum to 1.) |
|---|---|---|---|
| 3000 | 0.020 | (0.02, 0.005, 0.0005, 0.52, . . . , 0.015) | (0.002, 0.0003, 0.00003, 0.2, . . . , 0.125) |
| 2000 | 0.32 | (0.02, 0.0048, 0.00052, 0.533, . . . , 0.0166) | (0.002, 0.0003, 0.00003, 0.19, . . . , 0.135) |
| 1000 | 0.41 | (0.02, 0.0048, 0.00052, 0.543, . . . , 0.0173) | (0.002, 0.0003, 0.00003, 0.19, . . . , 0.127) |

In the above example, other interpolation parameters may be added for mixed fluids from different reservoirs, for example, a unique or special marker component of reservoir 2, e.g. R2H1.

Accordingly, the disclosed embodiments provide a method for using simplified compositional models for calculating properties of mixed fluids in a common surface network. In contrast to the disclosed embodiments, other approaches with different EOS models and black oil models tied to a common network all try to match the fluid behavior to a single equation of state model using a common set of components. Additionally, the disclosed embodiments also match to EOS models, but without the requirement that all components must exist within each fluid. Further, while other approaches then delump the fluids to the common EOS model at the sandface, the disclosed embodiments are configured to generate a multi-dimension interpolation table with a special marker component from each reservoir as a parameter. These tables are used in an approach which will replace the EOS equilibrium calculations.

Thus, advantages of the disclosed embodiments over prior methods include increased computational efficiency and in some cases, more accuracy. Additionally, in parts of the reservoir that have no commingling of fluids from different reservoirs, the original EOS data may be used. Alternatively, the simplified table lookup technique may also be used everywhere for computational efficiency and consistency. In parts of the network where mixed fluids are produced from different reservoirs, the disclosed embodiments may be used as a basis for calculating the properties of the mixed fluids that are produced from the mixing of EOS fluids from different reservoirs in different proportions. The disclosed embodiments allow the operators to keep their original EOS characterization, thereby providing a relatively efficient way for calculating properties of mixed fluids in the common network.

Figure 5:
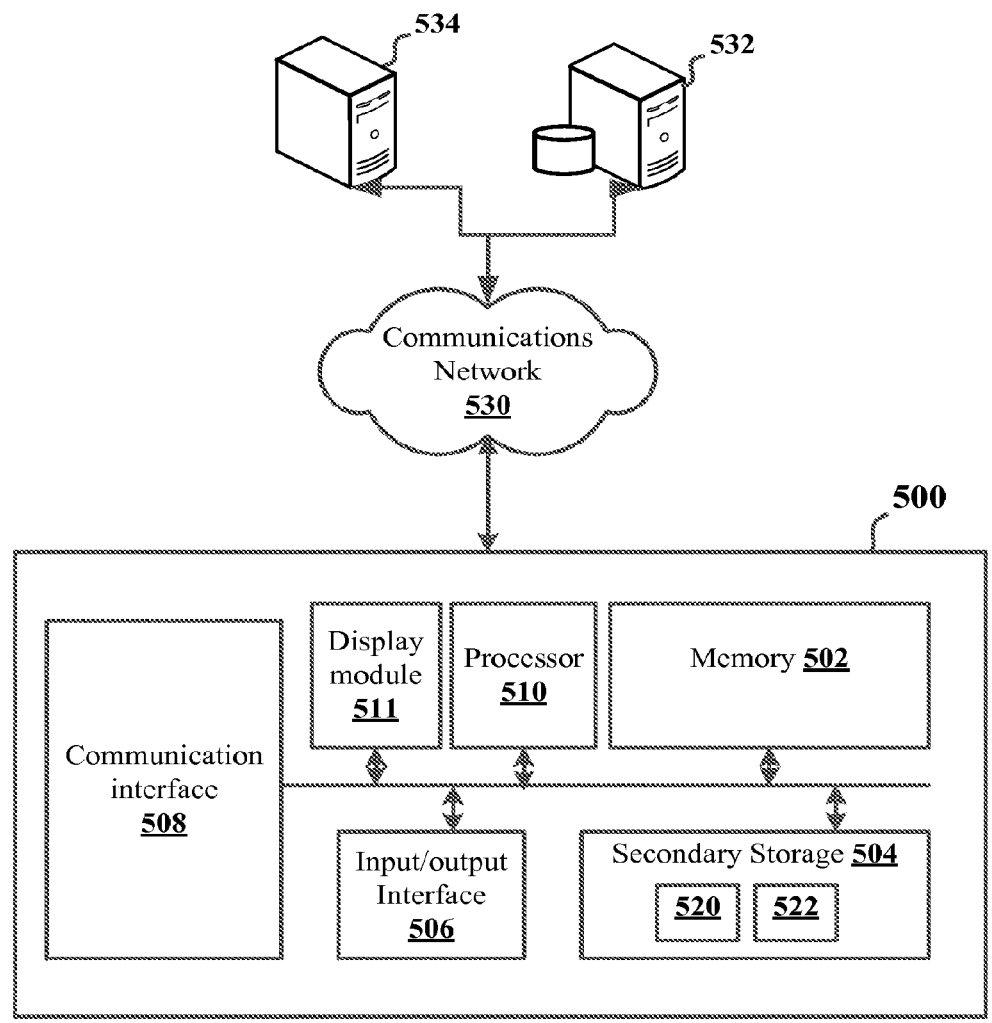
FIG. 5 is a block diagram of an exemplary computer system in which embodiments of the present disclosure may be implemented.

FIG. 5 is a block diagram of an exemplary computer system 500 in which embodiments of the present disclosure may be implemented. For example, system 500 may be used to implement system 200 of FIG. 2, as described above. The system 500 may be any type of computing device including, but not limited to, a desktop computer, a laptop, a server, a tablet, and a mobile device. The system 500 includes, among other components, a processor 510, main memory 502, secondary storage unit 504, an input/output interface module 506, and a communication interface module 508.

The processor 510 may be any type or any number of single core or multi-core processors capable of executing instructions for performing the features and functions of the disclosed embodiments. The input/output interface module 506 enables the system 500 to receive user input (e.g., from a keyboard and mouse) and output information to one or more devices such as, but not limited to, printers, external data storage devices, and audio speakers. The system 500 may optionally include a separate display module 511 to enable information to be displayed on an integrated or external display device. For instance, the display module 511 may include instructions or hardware (e.g., a graphics card or chip) for providing enhanced graphics, touchscreen, and/or multi-touch functionalities associated with one or more display devices.

Main memory 502 is volatile memory that stores currently executing instructions/data or instructions/data that are prefetched for execution. The secondary storage unit 504 is non-volatile memory for storing persistent data. The secondary storage unit 504 may be or include any type of data storage component such as a hard drive, a flash drive, or a memory card. In one embodiment, the secondary storage unit 504 stores the computer executable code/instructions and other relevant data for enabling a user to perform the features and functions of the disclosed embodiments.

For example, in accordance with the disclosed embodiments, the secondary storage unit 504 may permanently store executable code/instructions 520 for performing the steps of method 400 of FIG. 4, as described above. The executable code/instructions 520 are then loaded from the secondary storage unit 504 to main memory 502 during execution by the processor 510 for performing the disclosed embodiments. In addition, the secondary storage unit 504 may store other executable code/instructions and data 522 such as, but not limited to, a reservoir simulation application (e.g., a reservoir simulation application) for use with the disclosed embodiments.

The communication interface module 508 enables the system 500 to communicate with the communications network 530. For example, the network interface module 508 may include a network interface card and/or a wireless transceiver for enabling the system 500 to send and receive data through the communications network 530 and/or directly with other devices.

The communications network 530 may be any type of network including a combination of one or more of the following networks: a wide area network, a local area network, one or more private networks, the Internet, a telephone network such as the public switched telephone network (PSTN), one or more cellular networks, and/or wireless data networks. The communications network 530 may include a plurality of network nodes (not depicted) such as routers, network access points/gateways, switches, DNS servers, proxy servers, and other network nodes for assisting in routing of data/communications between devices.

For example, in one embodiment, the system 500 may interact with one or more servers 534 or databases 532 for performing the features of the disclosed embodiments. For instance, the system 500 may query the database 532 for well log information for creating a reservoir model in accordance with the disclosed embodiments. Further, in certain embodiments, the system 500 may act as a server system for one or more client devices or a peer system for peer to peer communications or parallel processing with one or more devices/computing systems (e.g., clusters, grids).

As described above, embodiments of the present disclosure are particularly useful for calculating properties of mixed fluids produced in a multi-reservoir system with a common surface network. In one embodiment of the present disclosure, a computer-implemented method of simulating fluid production in a multi-reservoir system with a common surface network includes: matching equation of state (EOS) characterization of fluids with a delumped EOS model for each of a plurality of reservoirs within the multi-reservoir system, where the delumped EOS model represents different components of the fluids for each reservoir; simulating fluid production in the multi-reservoir system for at least one simulation point in the common surface network, based in part on the delumped EOS model for each of the plurality of reservoirs; determining whether or not fluids produced during the simulation at the simulation point are mixed fluids from different reservoirs in the plurality of reservoirs; when the fluids at the simulation point are determined not to be mixed fluids produced from different reservoirs in the plurality of reservoirs, calculating properties of the fluids using the delumped EOS model corresponding to one of the plurality of reservoirs from which the fluids are produced; and when the fluids at the simulation point are determined to be mixed fluids produced from different reservoirs, generating one or more interpolation tables representing the mixed fluids produced from the different reservoirs via the common surface network, based on the corresponding delumped EOS model for each of the different reservoirs and calculating properties of the mixed fluids based on the one or more interpolation tables.

In a further embodiment, the one or more interpolation tables include compositional values that are tabulated as a function of one or more interpolation parameters. In yet a further embodiment, the different fluid components represented by the delumped EOS model for each reservoir include at least one heavy fluid component that is unique to that reservoir. In yet a further embodiment, the different fluid components further include at least one light fluid component that is common amongst the plurality of reservoirs. In yet a further embodiment, the heavy fluid component is a unique heavy oil component and the light fluid component is a common gas component. In yet a further embodiment, the one or more interpolation tables represent the fluids of each of the plurality of reservoirs in proportion to the unique heavy oil component of each reservoir relative to the reservoir's fluid pressure. In yet a further embodiment, the one or more interpolation tables are used in place of phase equilibrium calculations for the mixed fluids, and calculating properties of the mixed fluids comprises performing a table look-up of fluid properties using the one or more interpolation tables. In yet a further embodiment, the table look-up is performed using at least one of a set of tabulated compositionally dependent K-values, an EOS interpolation, or compositional tie-lines relating to oil and gas compositions of the mixed fluids.

In another embodiment of the present disclosure, a system for defining non-linear petrofacies for a reservoir simulation model includes at least one processor and a memory coupled to the processor has instructions stored therein, which when executed by the processor, cause the processor to perform functions, including functions to: match equation of state (EOS) characterization of fluids with a delumped EOS model for each of a plurality of reservoirs within the multi-reservoir system, the delumped EOS model representing different components of the fluids for each reservoir; simulate fluid production in the multi-reservoir system for at least one simulation point in the common surface network, based in part on the delumped EOS model for each of the plurality of reservoirs; determine whether or not fluids produced during the simulation at the simulation point are mixed fluids from different reservoirs in the plurality of reservoirs; when the fluids at the simulation point are determined not to be mixed fluids produced from different reservoirs in the plurality of reservoirs, calculate properties of the fluids using the delumped EOS model corresponding to one of the plurality of reservoirs from which the fluids are produced; and when the fluids at the simulation point are determined to be mixed fluids produced from different reservoirs, generate one or more interpolation tables representing the mixed fluids produced from the different reservoirs via the common surface network, based on the corresponding delumped EOS model for each of the different reservoirs and calculate properties of the mixed fluids based on the one or more interpolation tables.

In yet another embodiment of the present disclosure, a computer-readable storage medium has instructions stored therein, which when executed by a computer cause the computer to perform a plurality of functions, including functions to: match equation of state (EOS) characterization of fluids with a delumped EOS model for each of a plurality of reservoirs within the multi-reservoir system, the delumped EOS model representing different components of the fluids for each reservoir; simulate fluid production in the multi-reservoir system for at least one simulation point in the common surface network, based in part on the delumped EOS model for each of the plurality of reservoirs; determine whether or not fluids produced during the simulation at the simulation point are mixed fluids from different reservoirs in the plurality of reservoirs; when the fluids at the simulation point are determined not to be mixed fluids produced from different reservoirs in the plurality of reservoirs, calculate properties of the fluids using the delumped EOS model corresponding to one of the plurality of reservoirs from which the fluids are produced; and when the fluids at the simulation point are determined to be mixed fluids produced from different reservoirs, generate one or more interpolation tables representing the mixed fluids produced from the different reservoirs via the common surface network, based on the corresponding delumped EOS model for each of the different reservoirs and calculate properties of the mixed fluids based on the one or more interpolation tables.

While specific details about the above embodiments have been described, the above hardware and software descriptions are intended merely as example embodiments and are not intended to limit the structure or implementation of the disclosed embodiments. For instance, although many other internal components of the system 500 are not shown, those of ordinary skill in the art will appreciate that such components and their interconnection are well known.

In addition, certain aspects of the disclosed embodiments, as outlined above, may be embodied in software that is executed using one or more processing units/components.

Program aspects of the technology may be thought of as "products" or "articles of manufacture" typically in the form of executable code and/or associated data that is carried on or embodied in a type of machine readable medium. Tangible non-transitory "storage" type media include any or all of the memory or other storage for the computers, processors or the like, or associated modules thereof, such as various semiconductor memories, tape drives, disk drives, optical or magnetic disks, and the like, which may provide storage at any time for the software programming.

Additionally, the flowchart and block diagrams in the figures illustrate the architecture, functionality, and operation of possible implementations of systems, methods and computer program products according to various embodiments of the present invention. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The above specific example embodiments are not intended to limit the scope of the claims. The example embodiments may be modified by including, excluding, or combining one or more features or functions described in the disclosure.

What is claimed is:

1. A computer-implemented method of simulating a multi-reservoir production system to maximize fluid production, the method comprising:

obtaining, by a computer system via a communication network, wellsite data for fluids produced from each of a plurality of reservoirs in a multi-reservoir system having a common surface network;

generating an initial fluid model for each of the plurality of reservoirs, based on the wellsite data obtained for the fluids produced from that reservoir;

matching an equation of state (EOS) characterization of the initial fluid model generated for each of the plurality of reservoirs with a common EOS model of the multi-reservoir system, the common EOS model representing common fluid components for the plurality of reservoirs and at least one marker component that is unique to each reservoir;

simulating fluid production in the multi-reservoir system for different points in the common surface network, based in part on the common EOS model;

determining whether or not the simulated fluid production for each of the different points include mixed fluids from different reservoirs, based on the at least one marker component represented by the common EOS model for each of the different reservoirs;

calculating properties of fluids to be produced at each of the different points in the common surface network, based on the determination, wherein:

the calculation for each point at which the simulated fluid production is determined not to include mixed fluids is based on the initial fluid model for the corresponding reservoir from which the fluids are to be produced; and the calculation for each point at which the simulated fluid production is determined to include mixed fluids is based on a simplified compositional model that is generated as a function of the at least one marker component represented by the common EOS model for each of the different reservoirs from which the fluids are to be produced, wherein the simplified compositional model includes one or more interpolation tables of compositional values for different phase properties of the mixed fluids that are tabulated as a function of one or more interpolation parameters, and the one or more interpolation parameters include the at least one marker component that is unique to each of the different reservoirs from which the mixed fluids are produced;

determining operating settings for a selected group of the plurality of wells corresponding to the different points in the common surface network, based on the calculated properties of the fluids to be produced at each point; and controlling, using control signals transmitted from the computer system to a wellsite control unit at each of the selected group of wells via the communication network, production operations of the selected group of wells according to the determined operating settings.

2. The method of claim 1, wherein the at least one marker component for each of the different reservoirs is at least one heavy fluid component that is unique to that reservoir.

3. The method of claim 2, wherein the different fluid components further include at least one light fluid component that is common amongst the plurality of reservoirs.

4. The method of claim 3, wherein the heavy fluid component is a unique heavy oil component and the light fluid component is a common gas component.

5. The method of claim 4, wherein the one or more interpolation tables represent the different fluid components for each of the different reservoirs in proportion to the unique heavy oil component of that reservoir relative to the reservoir's fluid pressure.

6. The method of claim 5, wherein the one or more interpolation tables are used in place of phase equilibrium calculations for the mixed fluids, and calculating properties of the mixed fluids comprises performing a table look-up of fluid properties using the one or more interpolation tables.

7. The method of claim 6, wherein performing the table look-up comprises using at least one of a set of tabulated compositionally dependent K-values, an EOS interpolation, or compositional tie-lines relating to oil and gas compositions of the mixed fluids.

8. A system comprising:
at least one processor; and
a memory coupled to the processor having instructions stored therein, which when executed by the processor, cause the processor to perform functions including functions to:
obtain, via a communication network, wellsite data for fluids produced from each of a plurality of reservoirs in a multi-reservoir system having a common surface network;
generate an initial fluid model for each of the plurality of reservoirs, based on the wellsite data obtained for the fluids produced from that reservoir;
match an equation of state (EOS) characterization of the initial fluid model generated for each of the plurality of reservoirs with a common EOS model of the multi-reservoir system, the common EOS model representing common fluid components for the plurality of reservoirs and at least one marker component that is unique to each reservoir;
simulate fluid production in the multi-reservoir system for different points in the common surface network, based in part on the common EOS model;
determine whether or not the simulated fluid production for each of the different points includes mixed fluids from different reservoirs, based on the at least one marker component represented by the common EOS model for each of the different reservoirs;
calculate properties of fluids to be produced at each of the different points in the common surface network, based on the determination, wherein:
the calculation for each point at which the simulated fluid production is determined not to include mixed fluids is based on the initial fluid model for the corresponding reservoir from which the fluids are to be produced; and
the calculation for each point at which the simulated fluid production is determined to include mixed fluids is based on a simplified compositional model that is generated as a function of the at least one marker component represented by the common EOS model for each of the different reservoirs from which the fluids are to be produced, wherein the simplified compositional model includes one or more interpolation tables of compositional values for different phase properties of the mixed fluids that are tabulated as a function of one or more interpolation parameters, and the one or more interpolation parameters include the at least one marker component that is unique to each of the different reservoirs from which the mixed fluids are produced;
determine operating settings for a selected group of the plurality of wells corresponding to the different points in the common surface network, based on the calculated properties of the fluids to be produced at each point; and
control, using control signals transmitted from the computer system to a wellsite control unit at each of the selected group of wells via the communication network, production operations of the selected group of wells according to the determined operating settings.

9. The system of claim 8, wherein the at least one marker component for each of the different reservoirs is at least one heavy fluid component that is unique to that reservoir.

10. The system of claim 9, wherein the different fluid components further include at least one light fluid component that is common amongst the plurality of reservoirs.

11. The system of claim 10, wherein the heavy fluid component is a unique heavy oil component and the light fluid component is a common gas component.

12. The system of claim 11, wherein the one or more interpolation tables represent the different fluid components for each of the different reservoirs in proportion to the unique heavy oil component of that reservoir relative to the reservoir's fluid pressure.

13. The system of claim 12, wherein the one or more interpolation tables are used in place of phase equilibrium calculations for the mixed fluids, and the properties of the mixed fluids are calculated by performing a table look-up of fluid properties using the one or more fluid property tables.

14. The system of claim 13, wherein the table look-up is performed using at least one of a set of tabulated compositionally dependent K-values, an EOS interpolation, or compositional tie-lines relating to oil and gas compositions of the mixed fluids.

15. A non-transitory computer-readable storage medium having instructions stored therein, which when executed by a computer cause the computer to perform a plurality of functions, including functions to:

obtain, via a communication network, wellsite data for fluids produced from each of a plurality of reservoirs in a multi-reservoir system having a common surface network;

generate an initial fluid model for each of the plurality of reservoirs, based on the wellsite data obtained for the fluids produced from that reservoir;

match an equation of state (EOS) characterization of the initial fluid model generated for each of the plurality of reservoirs with a common EOS model of the multi-reservoir system, the common EOS model representing common fluid components for the plurality of reservoirs and at least one marker component that is unique to each reservoir;

simulate fluid production in the multi-reservoir system for different points in the common surface network, based in part on the common EOS model;

determine whether or not the simulated fluid production for each of the different points includes mixed fluids from different reservoirs, based on the at least one marker component represented by the common EOS model for each of the different reservoirs;

calculate properties of fluids to be produced at each of the different points in the common surface network, based on the determination, wherein:

the calculation for each point at which the simulated fluid production is determined not to include mixed fluids is based on the initial fluid model for the corresponding reservoir from which the fluids are to be produced; and the calculation for each point at which the simulated fluid production is determined to include mixed fluids is based on a simplified compositional model that is generated as a function of the at least one marker component represented by the common EOS model for each of the different reservoirs from which the fluids are to be produced, wherein the simplified compositional model includes one or more interpolation tables of compositional values for different phase properties of the mixed fluids that are tabulated as a function of one or more interpolation parameters, and the one or more interpolation parameters include the at least one marker component that is unique to each of the different reservoirs from which the mixed fluids are produced;

determine operating settings for a selected group of the plurality of wells corresponding to the different points in the common surface network, based on the calculated properties of the fluids to be produced at each point; and control, using control signals transmitted from the computer system to a wellsite control unit at each of the selected group of wells via the communication network, production operations of the selected group of wells according to the determined operating settings.

16. The non-transitory computer-readable storage medium of claim 15, wherein the at least one marker component for each of the different reservoirs is at least one heavy fluid component that is unique to that reservoir.

17. The non-transitory computer-readable storage medium of claim 16, wherein the different fluid components further include at least one light fluid component that is common amongst the plurality of reservoirs.

* * * * *